(12) United States Patent
Furuta et al.

(10) Patent No.: US 7,965,209 B2
(45) Date of Patent: Jun. 21, 2011

(54) A/D CONVERSION CIRCUIT AND A/D CONVERSION METHOD

(75) Inventors: Shingo Furuta, Kanagawa (JP); Hiroyuki Kohamada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/707,270

(22) Filed: Feb. 17, 2010

(65) Prior Publication Data
US 2010/0207801 A1 Aug. 19, 2010

(30) Foreign Application Priority Data
Feb. 17, 2009 (JP) ................................. 2009-033693

(51) Int. Cl.
*H03M 1/00* (2006.01)

(52) U.S. Cl. ........ 341/141; 341/118; 341/120; 341/155; 341/161

(58) Field of Classification Search .......... 341/118–121, 341/141, 142, 155, 161
See application file for complete search history.

(56) References Cited

U.S. PATENT DOCUMENTS

| | | | | |
|---|---|---|---|---|
| 6,073,848 A * | 6/2000 | Giebel | ...................... | 235/462.26 |
| 6,285,305 B1 * | 9/2001 | Feld et al. | ...................... | 341/139 |
| 6,369,739 B1 * | 4/2002 | Inada et al. | ...................... | 341/155 |
| 6,583,745 B2 * | 6/2003 | Sakakibara et al. | .......... | 341/155 |
| 6,593,871 B1 * | 7/2003 | Miethig et al. | ................. | 341/157 |
| 7,030,791 B2 * | 4/2006 | Harada | .......................... | 341/118 |
| 7,068,195 B1 * | 6/2006 | Menkus | .......................... | 341/141 |
| 7,209,066 B1 * | 4/2007 | Trumbo | .......................... | 341/155 |
| 7,292,170 B2 * | 11/2007 | Kinyua et al. | ................. | 341/141 |
| 7,616,052 B1 * | 11/2009 | Ju et al. | .......................... | 327/552 |
| 7,786,918 B2 * | 8/2010 | Fukuzawa et al. | ............ | 341/155 |
| 2010/0052958 A1 * | 3/2010 | Roeven et al. | ................. | 341/139 |

FOREIGN PATENT DOCUMENTS
JP 2000-196451 A 7/2000
* cited by examiner

*Primary Examiner* — Linh V Nguyen
(74) *Attorney, Agent, or Firm* — Foley & Lardner LLP

(57) ABSTRACT

An A/D (analog-to-digital) conversion circuit includes an input signal selecting circuit configured to output voltage signals of different signal levels in response to control signals in an adjustment mode before A/D conversion of an analog signal in a practical mode; an A/D converter configured to perform A/D conversion on the voltage signals in response to an adjustment sampling clock signal in the adjustment mode to output adjustment conversion values; and a sampling timing adjusting circuit configured to delay a reference sampling clock signal based on a delay value selected in response to a selection signal in the adjustment mode to output the adjustment sampling clock signal to the A/D converter. An operation circuit is configured to set the adjustment mode, output the control signals to the input signal selecting circuit, and the selection signal to the sampling timing adjusting circuit, such that the adjustment conversion values are obtained at each of different delay values, determine an optimal parameter from parameters corresponding to the obtained adjustment conversion values, and set the practical mode to output the selection signal corresponding to the optimal parameter to the sampling timing adjusting circuit.

18 Claims, 6 Drawing Sheets

A/D CONVERSION CIRCUIT AND A/D CONVERSION METHOD

INCORPORATION BY REFERENCE

This patent application claims a priority on convention based on Japanese Patent Application No. 2009-033693. The disclosure thereof is incorporated herein by reference.

TECHNICAL FIELD

The present invention relates to an analog-to-digital (A/D) conversion technique for converting an analog signal into a digital signal.

BACKGROUND ART

An analog and digital circuit mixed technique is important for an LSI (Large-Scale Integrated circuit). In such a circuit, noise measurements would become important due to miniaturization and low power supply voltage of the LSI. Specifically, when an analog-to-digital (A/D) conversion circuit is mounted on a chip on which a digital circuit is mounted, noise becomes important which is synchronized with a clock signal sent from the digital circuit and propagated through a substrate. The A/D conversion circuit includes a sampling and holding circuit and a comparator. The sampling and holding circuit samples an analog signal and holds the sampled analog value. The comparator compares the sampled analog value with a reference analog value to output a comparison result as a digital value. Thus, the A/D conversion is carried out. Here, the sampling and holding circuit has a high noise sensitivity and receives influence on characteristics, especially, an A/D conversion characteristic. In such a situation, it is well known to shift a sampling and holding timing from a clock signal timing in the digital circuit for the noise measurement.

However, if the scale of the digital circuit becomes large so that a digital circuit operation becomes complicated, it is more difficult to set to an optimal value, a phase difference between the sampling and holding timing in the A/D conversion circuit and the clock signal timing in the digital circuit. Moreover, if influence of a manufacturing variation and a temperature drift is taken into consideration, it is impossible to set an optimum phase difference in advance.

Japanese Patent Publication (JP 2000-196451A) discloses a conventional A/D conversion circuit in which a noise sensitivity is suppressed by adjusting the sampling and holding timing. The conventional A/D conversion circuit is incorporated in an LSI semiconductor chip and includes an A/D converter and a clock phase adjusting circuit. The clock phase adjusting circuit includes delay elements (e.g. inverter circuits) and sets a plurality of phase differences in advance by combinations of the delay elements after completion of the semiconductor chip. In the conventional A/D conversion circuit, if the A/D converter only provides an insufficient A/D conversion precision because of power supply noise, a timing difference is changed between a generation timing of the power supply noise from a logic circuit section and a timing of a clock signal supplied to the A/D converter by the clock phase adjusting circuit in response to an instruction, even after completion of the LSI semiconductor chip. Thus, the conventional A/D conversion circuit carries out A/D conversion without influence of the power supply noise from the logic circuit section. The manufacturing variation and the temperature drift are not taken into consideration in this timing difference.

When the timing difference between a sampling and holding timing in the A/D conversion circuit and a timing of noise propagated through the substrate due to clock signal for a digital circuit is to be set in advance, it is impossible to adjust the sampling and holding timing to an optimum value because of the noise amplitude and noise phase which depend on the manufacturing variation and the temperature drift.

What is considered as a mechanism of noise generation in general is charging/discharging in a power supply terminal and a ground terminal in transition of a CMOS logic gate. In this case, noise which contains a frequency component due to an inductance component existing parasitically in a digital circuit and a change of a current is generated and the noise is partially propagated into a substrate. In this case, the current is variable depending on changes of an operational voltage and an operation temperature and manufacturing variation, so that the noise amplitude changes. Accordingly, even if a phase difference is set after completion of a semiconductor chip in a conventional A/D conversion circuit, the set phase difference is not optimum to the phase and amplitude of noise in a usage state by a user.

SUMMARY OF THE INVENTION

In an aspect of the present invention, an A/D (analog-to-digital) conversion circuit includes an input signal selecting circuit configured to output voltage signals of different signal levels in response to control signals in an adjustment mode before A/D conversion of an analog signal in a practical mode; an A/D converter configured to perform A/D conversion on the voltage signals in response to an adjustment sampling clock signal in the adjustment mode to output adjustment conversion values; and a sampling timing adjusting circuit configured to delay a reference sampling clock signal based on a delay value selected in response to a selection signal in the adjustment mode to output the adjustment sampling clock signal to the A/D converter. An operation circuit is configured to set the adjustment mode, output the control signals to the input signal selecting circuit, and the selection signal to the sampling timing adjusting circuit, such that the adjustment conversion values are obtained at each of different delay values, determine an optimal parameter from parameters corresponding to the obtained adjustment conversion values, and set the practical mode to output the selection signal corresponding to the optimal parameter to the sampling timing adjusting circuit.

In another aspect of the present invention, an A/D (analog-to-digital) conversion method is achieved by setting an adjustment mode; by generating control signals to an input signal selecting circuit, each time generating a selection signal to a sampling timing adjusting circuit in the adjustment mode, such that adjustment conversion values are obtained at each of different delay values; by outputting voltage signals of different signal levels from the input signal selecting circuit in response to the control signals in the adjustment mode before A/D conversion of an analog signal in a practical mode; by delaying a reference sampling clock signal based on the delay value selected in response to the selection signal in the sampling timing adjusting circuit in the adjustment mode to output an adjustment sampling clock signal to an A/D converter; performing A/D conversion on the voltage signals in response to the adjustment sampling clock signal in the A/D converter in the adjustment mode to output adjustment conversion values; by determining an optimal parameter from parameters corresponding to the obtained adjustment conversion values; and by setting the practical mode to output the selection signal corresponding to the optimal parameter to the sampling timing adjusting circuit.

According to the A/D conversion circuit according to the present invention, a phase difference between a sampling and holding timing and a timing of noise generated due to a clock signal of a digital circuit and propagated through substrate can be always adjusted to an optimum phase difference, by setting the sampling and holding timing in the A/D conversion circuit in accordance with actual operating environment, even if the amplitude and phase of noise change depending on an operational voltage, manufacturing variation and temperature drift.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF PREFERRED EMBODIMENTS

Hereinafter, an analog-to-digital (A/D) conversion circuit according to the present invention will be described in detail with reference to the attached drawings.

First Embodiment

Figure 1:
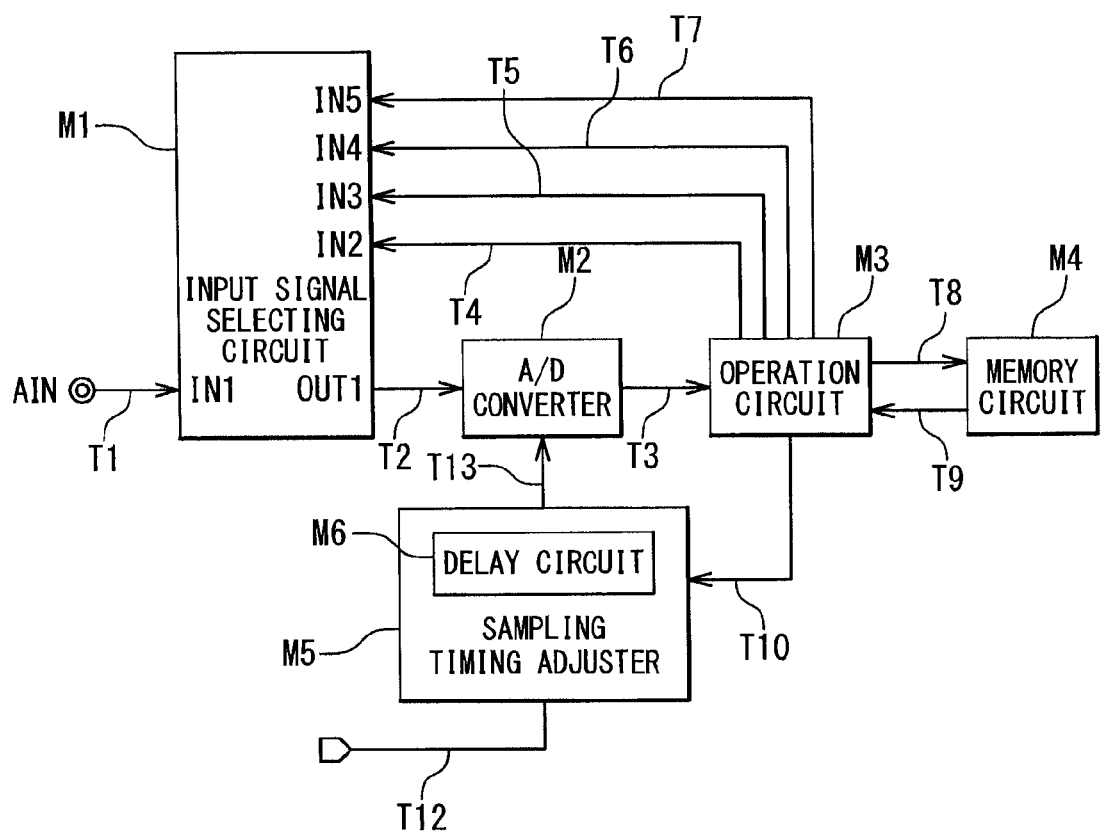
FIG. 1 is a block diagram showing a configuration of an A/D conversion circuit according to first and second embodiments of the present invention.

FIG. 1 is a block diagram showing a configuration of an A/D conversion circuit according to a first embodiment of the present invention. The A/D conversion circuit according to the first embodiment of the present invention includes an input signal selecting circuit M1, an A/D converter M2, an operation circuit M3, a storage circuit M4 and a sampling timing adjuster M5.

The input signal selecting circuit M1 is provided with terminals IN1 to IN5 and OUT 1. The terminal IN1 is connected to a terminal AIN to which an analog signal T1 is supplied. Control signals T4 to T7 are supplied to the terminals IN2 to IN5, respectively. The input signal selecting circuit M1 outputs as a signal T2, a first voltage signal T15 (an analog signal S1) from the terminal OUT1 to the A/D converter M2 in response to an active control signal T6 (e.g. of "1"). The input signal selecting circuit M1 outputs as the signal T2, a second voltage signal T17 (analog signal S2) whose level is lower than that of the analog signal S1, from the terminal OUT1 to the A/D converter M2 in response to an active control signal T4 (e.g. of "1"). The input signal selecting circuit M1 outputs as the signal T2, a third voltage signal T16 (analog signal S3) whose level is between the analog signal S1 and the analog signal S2, from the terminal OUT1 to the A/D converter M2 in response to an active control signal T5 (e.g. of "1"). The input signal selecting circuit M1 outputs as the signal T2, a fourth voltage signal T14 (analog signal S4) which is supplied to the terminal IN1 through the terminal AIN, from the terminal OUT1 to the A/D converter M2 in response to an active control signal T7 (e.g. "1").

The A/D converter M2 receives the analog signal S1 supplied from the input signal selecting circuit M1 and a sampling clock signal T13 supplied from the sampling timing adjuster M5. The A/D converter M2 carries out in response to the sampling clock signal T13, A/D conversion on the analog signal S1 supplied from the input signal selecting circuit M1, and outputs a first conversion value C(n) obtained thus as T3 to the operation circuit M3. The A/D converter M2 carries out in response to the sampling clock signal T13, the A/D conversion on the analog signal S2 supplied from the input signal selecting circuit M1, and outputs a second conversion value A(n) obtained thus as T3 to the operation circuit M3. The A/D converter M2 carries out in response to the sampling clock signal T13, the A/D conversion on the analog signal S3 supplied from the input signal selecting circuit M1, and outputs a third conversion value B(n) obtained thus as T3 to the operation circuit M3. The A/D converter M2 carries out in response to the sampling clock signal T13, the A/D conversion on the analog signal S4 supplied from the input signal selecting circuit M1, and outputs a conversion value obtained thus as T3.

The operation circuit M3 outputs the control signals T4 to T7. The operation circuit M3 sets the signal level of one of the control signal T7 to the active state of "1" and holds it. Accordingly, the transfer gate of the P-type transistor MP4 and the N-type transistor MN3 is set to the non-conductive state. Then, the operation circuit M3 sequentially sets the signal levels of the control signals T6, T4 and T5 to the active state of "1" and sets the signal levels of the remaining control signals to an inactive state of "0".

The operation circuit M3 generates (or determines) a conversion characteristic representing a relation of a voltage difference between the analog signal S1 and the analog signal S2 and a difference between the first conversion value C(n) and the second conversion value A(n). After the control signal T6, T4 and T5 are all set to the active state, the operation circuit M3 outputs a delay value selection signal T10 to the sampling timing adjuster M5.

The storage circuit M4 receives and outputs data from/to the operation circuit M3 via data buses T8 and T9.

The sampling timing adjuster M5 includes a delay circuit M6. The delay circuit M6 holds N (N is an integer equal to or more than 2) delay values set in advance. The N delay values are different from each other, and gradually increase. A reference sampling clock signal T12 is supplied to the sampling timing adjuster M5. In response to a $J^{th}$ (J is an integer which satisfies $1 \leq J \leq N$) delay value selection signal T10, the sampling timing adjuster M5 selects the $J^{th}$ delay value D(n) (n=J) from the N delay values and the delay circuit M6 delays the reference sampling clock signal T12 by the $J^{th}$ delay value D(n) (n=J) to generate the sampling clock signal T13, which is supplied to the A/D converter M2. For example, the sampling timing adjuster M5 delays the reference sampling clock signal T12 by a first delay value D(n) (n=1) initially (in a case of the first delay value selection signal T10), and supplies it as the sampling clock signal T13 to the A/D converter M2. Next, in response to the second delay value selection signal T10, the sampling timing adjuster M5 delays the reference sampling clock signal T12 by a second delay value D(n) (n=2), and supplies it as the sampling clock signal T13.

Figure 2:
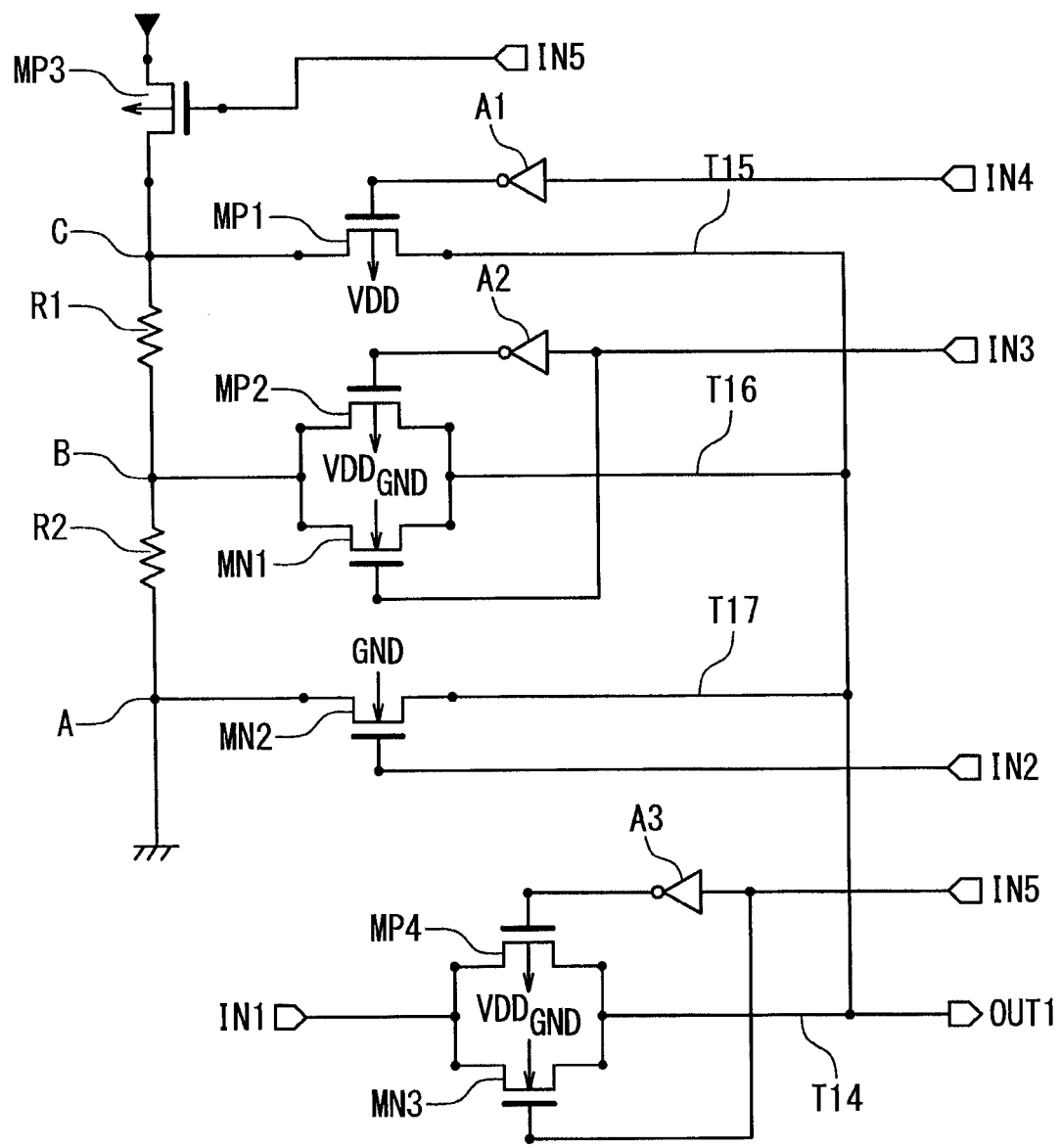
FIG. 2 is a circuit diagram showing a configuration of an input signal selecting circuit M1 shown in FIG. 1.

FIG. 2 shows a configuration of the input signal selecting circuit M1. The input signal selecting circuit M1 includes P-type MOS transistors MP1 to MP4, N-type MOS transistors MN1 to MN3, inverters A1 to A3 and serially connected resistance elements R1 and R2. The P-type transistors MP1 to MP4 and the N-type transistors MN1 to MN3 are used as switches.

The P-type transistor MP3 has a source to which a power supply voltage is supplied, and a drain which is connected to one end of the resistance element R1. The terminal IN5 is connected to a gate of the P-type transistor MP3 and is supplied with the control signal T7. The P-type transistor MP1 has a source which is connected to the drain of the P-type transistor MP3, and a gate which is connected to an output of the inverter A1. An input of the inverter A1 is connected to the terminal IN4 to which the control signal T6 is supplied.

The P-type transistor MP2 and the N-type transistor MN1 constitute a transfer gate. A source of the P-type transistor MP2 and a drain of the N-type transistor MN1 are connected to the other end of the resistance element R1 and one end of the resistance element R2. The P-type transistor MP2 has a gate which is connected to an output of the inverter A2, and the N-type transistor MN1 has a gate which is connected to an input of the inverter A2. The terminal IN3 is connected to the input of the inverter A2 is supplied with the control signal T5. The N-type transistor MN2 has a drain which is connected to the other end of the resistance element R2. The other end of the resistance element R2 is grounded. A gate of the N-type transistor MN2 is connected to the terminal IN2 to which the first control signal T4 is supplied.

The P-type transistor MP4 and the N-type transistor MN3 constitute a transfer gate. A source of the P-type transistor MP4 and a drain of the N-type transistor MN3 are connected to the terminal IN1. A gate of the P-type transistor MP4 is connected to an output of the inverter A3, and a gate of the N-type transistor MN31 is connected to an input of the inverter A3. An input of the inverter A3 is connected to the terminal IN5. The terminal OUT1 is connected to a drain of the P-type transistor MP4 and a source of the N-type transistor MN3, in addition to a drain of the P-type transistor MP1, a drain of the P-type transistor MP2 and a source of the N-type transistor MN1, and a drain of the N-type transistor MN2.

A back gate voltage is fixed to a power supply voltage in the P-type transistors MP1 to MP4. A back gate voltage is fixed to a ground voltage in the N-type transistors MN1 to MN3.

Here, at first, when the P-type transistor MP3 and the P-type transistor MP1 are turned on and the remaining transistors are turned off, the first voltage signal T15 (analog signal S1) is supplied to the terminal OUT1 as a power supply voltage. When the P-type transistor MP3 and the N-type transistor MN2 are turned on and the remaining transistors are turned off, the second voltage signal T17 (analog signal S2) is supplied to the terminal OUT1 as the ground voltage. When the P-type transistor MP3, the P-type transistor MP2 and the N-type transistor MN1 are turned on and the remaining transistors are turned off, the third voltage signal T16 (analog signal S3) is supplied to the terminal OUT1. When the P-type transistor MP4 and the N-type transistor MN3 are turned on and the remaining transistors are turned off, the fourth voltage signal T14 (analog signal S4) is supplied to the terminal OUT1.

Figure 3:
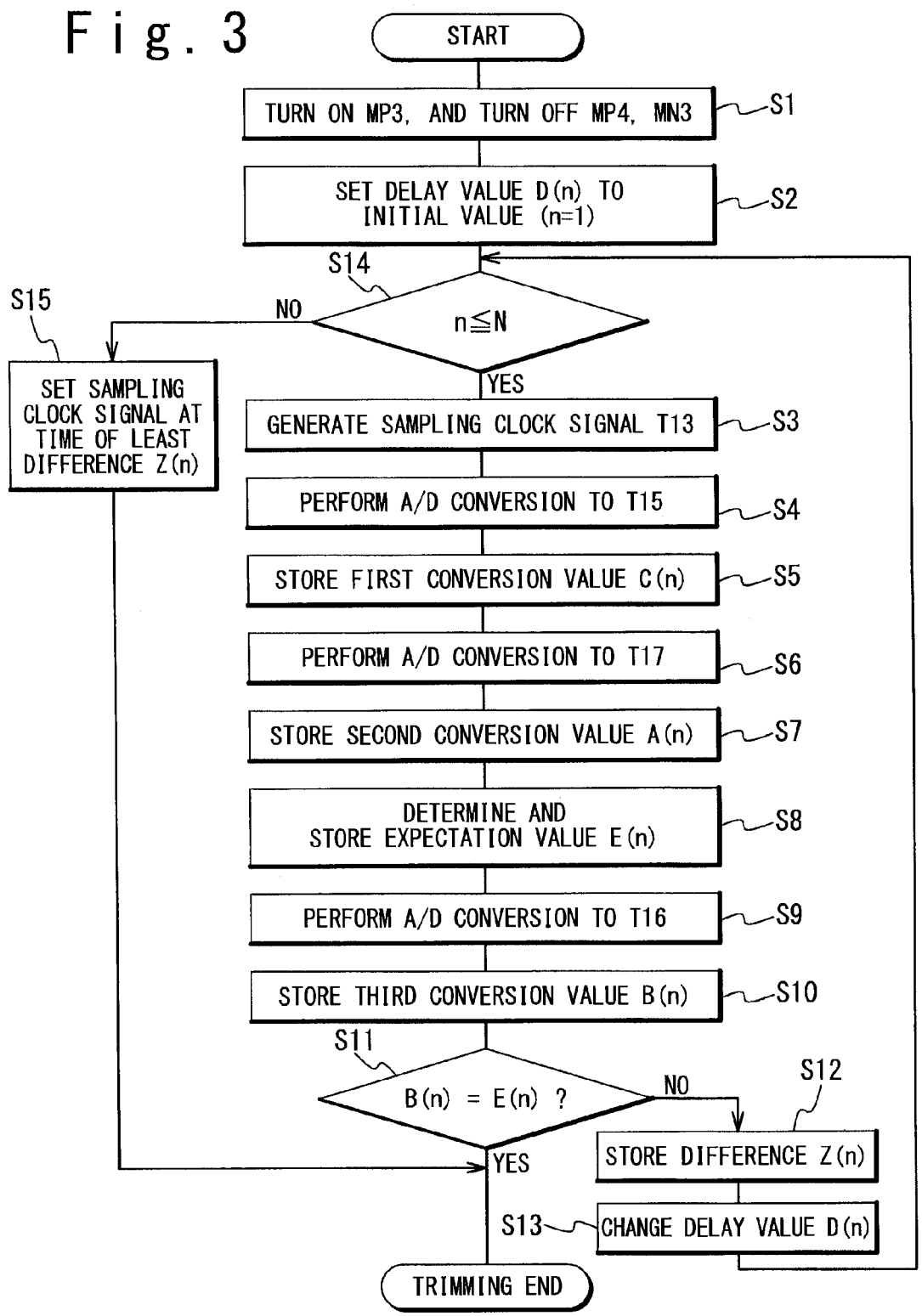
FIG. 3 is a flowchart showing an operation of the A/D conversion circuit according to the first embodiment of the present invention.
Figure 4:
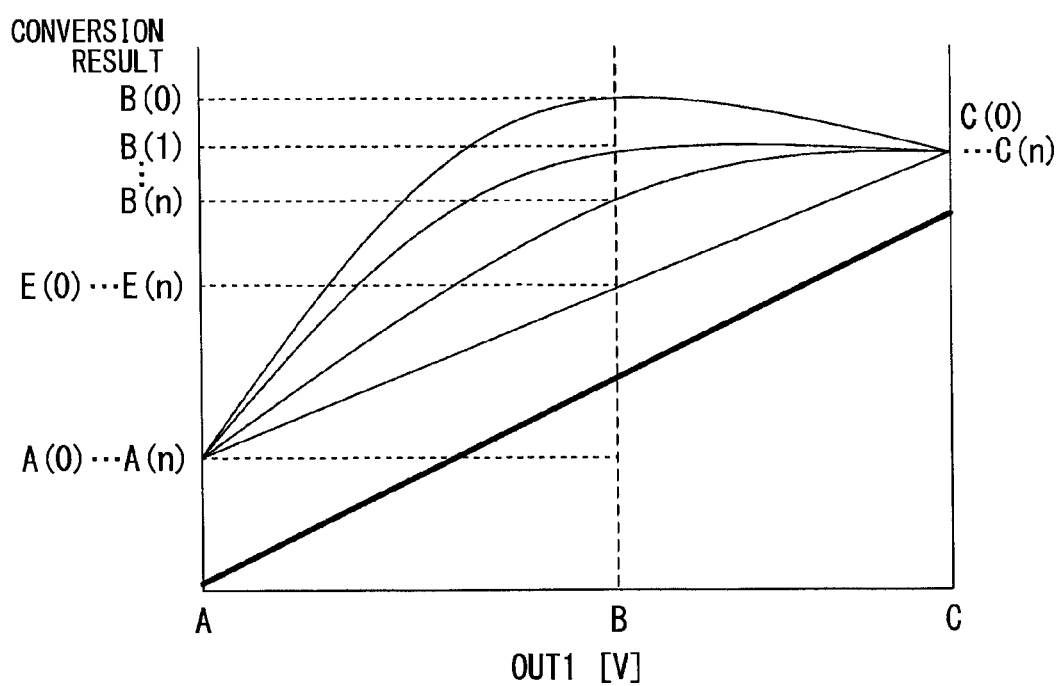
FIG. 4 shows a conversion characteristic of the A/D conversion circuit according to the first embodiment of the present invention.

FIG. 3 is a flowchart showing an operation of the A/D conversion circuit according to the first embodiment of the present invention in an adjustment mode and a practical mode. FIG. 4 shows a conversion characteristic in the A/D conversion circuit according to the first embodiment of the present invention.

The operation circuit M3 sets the signal levels of the control signals T6, T4, T5 and T7, which are respectively supplied to the terminals IN4, IN2, IN3 and IN5, to the inactive state of "0" in the adjustment mode. At this time, the P-type transistors MP1, MP2, MP4 and the N-type transistors MN1, MN2, and MN3 are turned off, and the P-type transistor MP3 is turned on (step S1). The sampling timing adjuster M5 selects the delay value D(n) (n=1) and the delay circuit M6 delays the reference sampling clock signal T12 by the selected delay value D(n) (n=1) to generate the sampling clock signal T13, which is supplied to the A/D converter M2 (steps S2, S14—YES, and S3).

The operation circuit M3 sets the signal level of the control signal T6 which is supplied to the terminal IN4, to the active state of "1". At this time, the P-type transistor MP1 is turned on. In response to the control signal T6, the input signal selecting circuit M1 outputs a first voltage signal T15 from the terminal OUT1 to the A/D converter M2. The A/D converter M2 carries out in response to the sampling clock signal T13, the A/D conversion on the first voltage signal T15 (analog signal S1) supplied from the input signal selecting circuit M1, and outputs a first conversion value C(n) (n=1) obtained thus to the operation circuit M3 (step S4). The operation circuit M3 stores the first conversion value C(n) in the storage circuit M4 (step S5).

The operation circuit M3 sets the signal level of the control signal T6 which is supplied to the terminal IN4, to the inactive state of "0", and sets the signal level of the control signal T4 which is supplied to the terminal IN2, to the active state of "1". At this time, the P-type transistor MP1 is turned off and the N-type transistor MN2 is turned on. In response to the control signal T4, the input signal selecting circuit M1 outputs the second voltage signal T17 (analog signal S2) from the terminal OUT1 to the A/D converter M2. The A/D converter M2 carries out in response to the sampling clock signal T13, the A/D conversion on the second voltage signal T17 (analog signal S2) supplied from the input signal selecting circuit M1, and outputs a second conversion value A(n) (n=1) obtained thus to the operation circuit M3 (step S6). The operation circuit M3 stores the second conversion value A(n) in the storage circuit M4 (step S7).

The operation circuit M3 reads the first conversion value C(n) and the second conversion value A(n) from the storage circuit M4. Here, one end of the resistance element R1, a connection point between the other end of the resistance element R1 and one end of the resistance element R2, and the other end of the resistance element R2 are referred to as nodes C, B and A, respectively. The first voltage signal T15 (analog signal S1), the third voltage signal T16 (analog signal S3) and the second voltage signal T17 (analog signal S2), which are supplied from the nodes A, B and C, are also referred to as C [V], B [V] and A [V], respectively. In this case, the operation circuit M3 generates a conversion characteristic representing a relation of a voltage difference between the first voltage C [V] and the second voltage A [V] and a difference between the first conversion value C(n) and the second conversion value A(n). The conversion value of the third voltage B [V] by use of the conversion characteristic is determined as an expected value E(n) (n=1) by the operation circuit M3. The operation circuit M3 stores the expected value E(n) in the storage circuit M4 (step S8).

The operation circuit M3 sets the signal level of the control signal T4 supplied to the terminal IN2 to the inactive state of "0", and sets the signal level of the control signal T5 supplied to the terminal IN3 to the active state of "1". At this time, the N-type transistor MN2 is turned off, and the P-type transistor MP2 and the N-type transistor MN1 are turned on. In response to the control signal T5 of "1", the input signal selecting circuit M1 outputs the third voltage signal T16 (analog signal S3) from the terminal OUT1 to the A/D converter M2. The A/D converter M2 carries out in response to the sampling clock signal T13, the A/D conversion on the third voltage signal T16 (analog signal S3) supplied from the input signal selecting circuit M1, and outputs a third conversion value B(n) (n=1) obtained thus to the operation circuit M3 (step S9). The operation circuit M3 stores the third conversion value B(n) in the storage circuit M4 (step S10).

The operation circuit M3 checks whether or not the third conversion value B(n) corresponds to the conversion characteristic. In this case, the operation circuit M3 reads the expected value E(n), which is determined from the conversion characteristic and the third voltage signal, and the third conversion value B(n) from the storage circuit M4 and compares these values with each other.

Whether the third conversion value B(n) correspond to the conversion characteristic, that is, whether the expected value E (n) is coincident with the third conversion value B(n) is determined (step S11). When the expected value E (n) is coincident with the third conversion value B(n), the operation circuit M3 determines that adjustment has been made for an optimum delay value, and sets the practical mode. The operation circuit M3 sets the signal level of the control signal T5 supplied to the terminal IN3 to the inactive state of "0" and sets the signal level of the control signal T7 supplied to the terminal IN5 to the active state of "1". At this time, the P-type transistor MP3, and MP2 and the N-type transistor MN1 are turned off, while the P-type transistor MP4 and the N-type transistor MN3 are turned on. In response to the control signal T7 of "1", the input signal selecting circuit M1 outputs the analog signal S4 supplied to the terminal IN1 via the terminal AIN from the terminal OUT1 to the A/D converter M2 as the fourth voltage signal T14 (analog signal S4). The A/D converter M2 carries out in response to the sampling clock signal T13, the A/D conversion on the fourth voltage signal T14 (analog signal S4) supplied from the input signal selecting circuit M1, and outputs a fourth conversion value T3 obtained thus.

In contrast, it is assumed in the adjustment mode that the third conversion value B(n) does not correspond to the conversion characteristic. That is, it is assumed that the expected value E(n) is not coincident with the third conversion value B(n) (step S11—NO). In this case, the operation circuit M3 stores a difference between the expected value E(n) and the third conversion value B(n) in the storage circuit M4 as a difference Z(n) (step S12), and then outputs the delay value selection signal T10 to the sampling timing adjuster M5. In response to the $J^{th}$ (J is an integer which satisfies $1 \leq J \leq N$) delay value selection signal T10, the sampling timing adjuster M5 selects the $J^{th}$ delay value D(n) (n=J) from the N delay values, and the delay circuit M6 delays the reference sampling clock signal T12 by the $J^{th}$ delay value D(n) (n=J), so as to supply to the A/D converter M2 as the sampling clock signal T13 (step S13). Then, J is incremented by "1". In a case of the first delay value selection signal T10, J is "1" (step S14—YES). In this case, in response to the first delay value selection signal T10, the sampling timing adjuster M5 delays the reference sampling clock signal T12 by the first delay value D(n) (n=1) to generate the sampling clock signal T13 and supplies the sampling clock signal T13 to the A/D converter M2 (step S3). The step S4 and the following steps are executed hereafter.

It is assumed in the adjustment mode that the step S11 is executed N times but no coincidence is obtained between the expected value E(n) and the third conversion value B(n). In this case, N differences Z(n) are stored in order in the storage circuit M4. The operation circuit M3 then selects an $I^{th}$ difference (I is an integer expressing any of 1 to N) which is the smallest difference of the N differences Z(n) stored in the storage circuit M4, and outputs a delay value selection signal for selecting a delay value corresponding to the smallest difference to the sampling timing adjuster M5 (step S15). In response to the delay value selection signal, the sampling timing adjuster M5 delays the reference sampling clock signal T12 by the selected delay value D(n) (n=I) and supplies the sampling clock signal T13 to the A/D converter M2.

In this case, the operation circuit M3 sets the signal level of the control signal T5 supplied to the terminal IN3 to the inactive state of "0", and sets the signal level of the control signal T7 supplied to the terminal IN5 to the active state of "1". At this time, the P-type transistor MP3, and MP2 and the N-type transistor MN1 are turned off, while the P-type transistor MP4 and the N-type transistor MN3 are turned on. In response to the control signal T7 of "1", the input signal selecting circuit M1 outputs the fourth voltage signal T1 (analog signal S4), which is supplied to the terminal IN1 via the terminal AIN, from the terminal OUT1 to the A/D converter M2. The A/D converter M2 carries out in response to the sampling clock signal T13, the A/D conversion on the fourth voltage signal T14 (analog signal S4) supplied from the input signal selecting circuit M1, and outputs a fourth conversion value T3 obtained thus.

As described above, in the A/D conversion circuit according to the first embodiment of the present invention, it is possible to always adjust to an optimum value, a phase difference between the sampling and holding timing and the timing of noise propagated through substrate due to a clock signal of a digital circuit by setting the sampling and holding timing of the A/D conversion circuit in accordance with actual operating environment, even if the noise amplitude and the phase are changed depending on an operational voltage, manufacturing variations and a temperature drift.

Second Embodiment

In the first embodiment, whether or not the phase adjustment has been made to an optimum delay value is determined by using a delay value corresponding to the smallest difference between the expected value E(n) and the third conversion value B(n) as an optimum value. In the A/D conversion circuit according to a second embodiment of the present invention, whether or not the phase adjustment has been made to an optimum delay value is determined by using a delay value corresponding to the smallest angle φ(n) between an expected value conversion characteristic and a conversion characteristic as an optimum value. In the description of the second embodiment, the same description as in the first embodiment will be omitted.

An A/D conversion circuit according to the second embodiment of the present invention has a configuration which is the same as that of the first embodiment.

Figure 5:
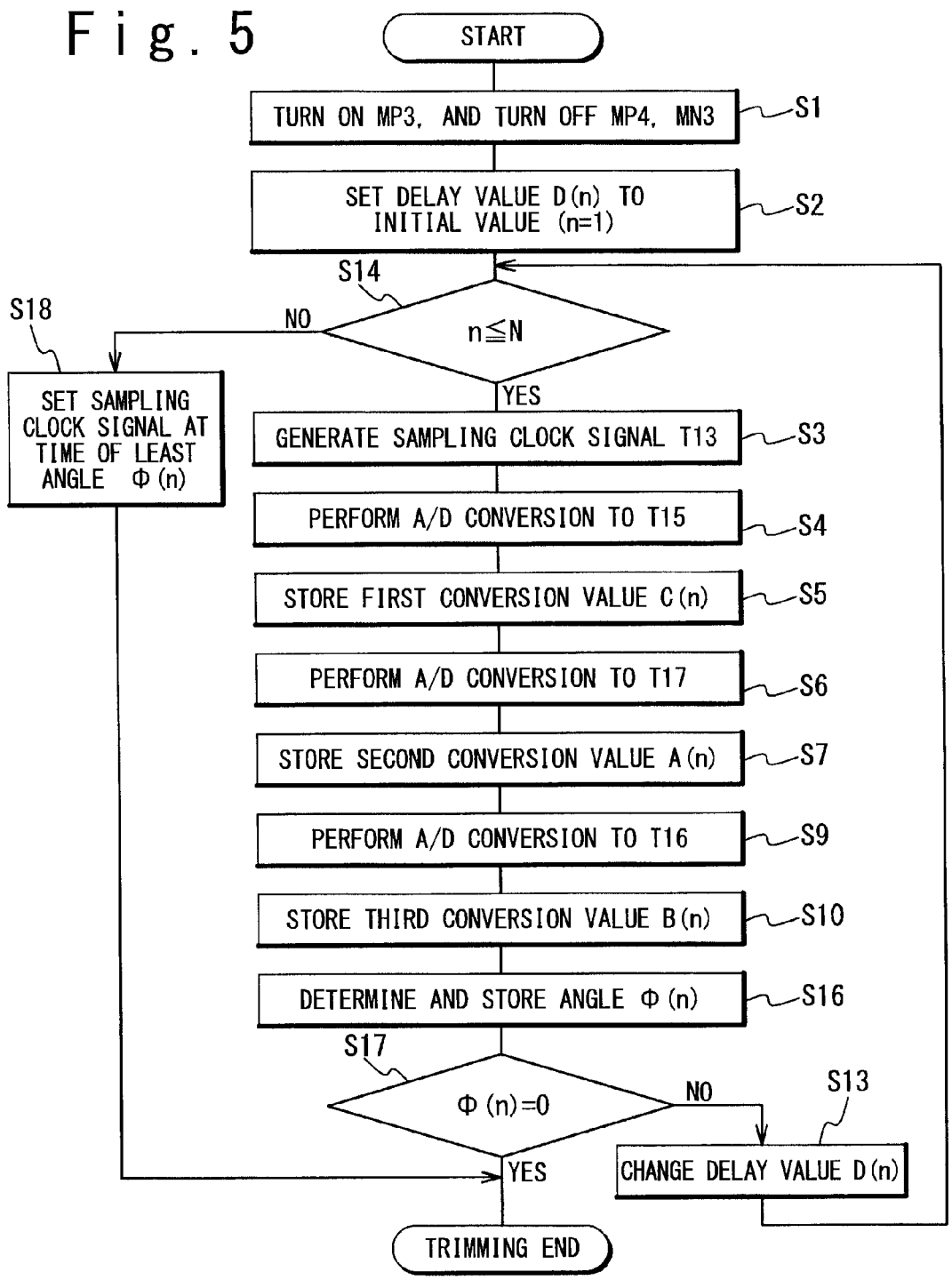
FIG. 5 is a flowchart showing an operation of the A/D conversion circuit according to a second embodiment of the present invention.
Figure 6:
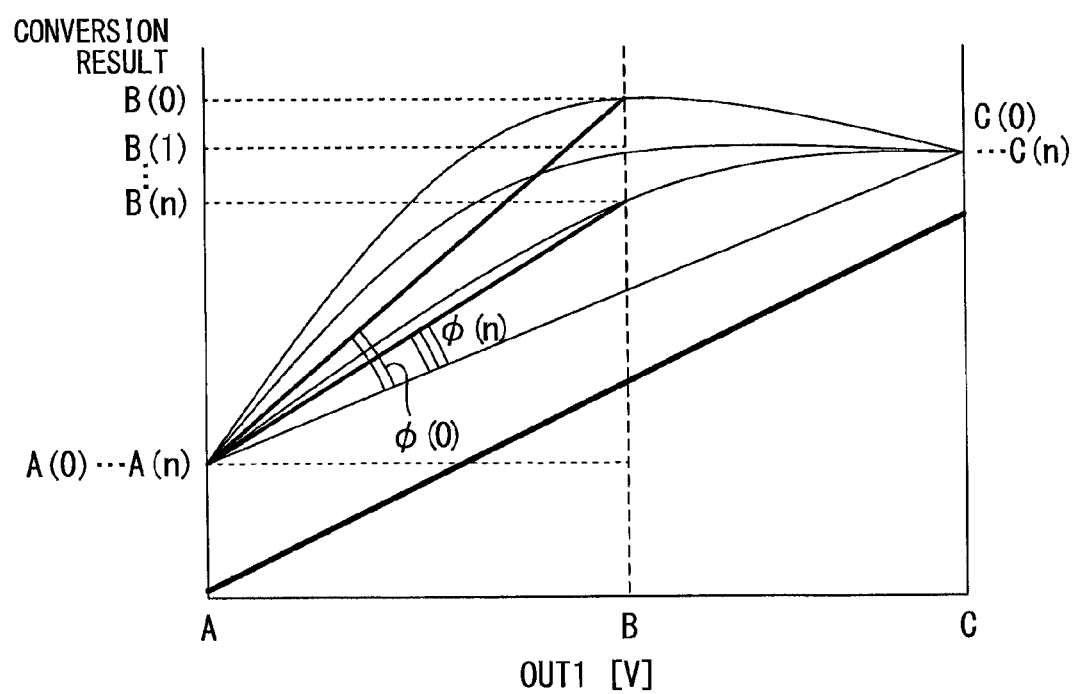
FIG. 6 shows a conversion characteristic in the A/D conversion circuit according to the second embodiment of the present invention.

FIG. 5 is a flowchart showing an operation of the A/D conversion circuit according to the second embodiment of the present invention. FIG. 6 shows a conversion characteristic in the A/D conversion circuit according to the second embodiment of the present invention. In the second embodiment, the steps S8 and S12 in the first embodiment are omitted. Also, steps S16 and S17 to be described later are added in the second embodiments, in place of the step S11 in the first embodiment. Also, a step S18 to be described later is added in the second embodiment, in place of the step S15 in the first embodiment.

First, the above steps S1, S2, S14—YES and S3 through S7 are executed.

Next, the steps S9 and S10 are executed.

The operation circuit M3 reads the first conversion value C(n), the third conversion value B(n) and the second conversion value A(n) from the storage circuit M4. Here, one end of the resistance element R1, a connection point between the other end of the resistance element R1 and one end of the resistance element R2, and the other end of the resistance element R2 are referred to as the nodes C, B and A, respectively. The first voltage T15 (analog signal voltage S1), the third voltage T16 (analog signal voltage S3) and the second voltage T17 (analog signal voltage S2) supplied to the nodes A, B and C are also referred to as C [V], B [V] and A [V], respectively. In this case, the operation circuit M3 generates (or determines) a conversion characteristic representing a relation of a voltage difference between the first voltage C [V] and the second voltage A [V] and a difference between the first conversion value C(n) and the second conversion value A(n). The operation circuit M3 also generates (or determines) an expected value conversion characteristic representing a relation of a voltage difference between the third voltage B [V] and the second voltage A [V] and a difference between the third conversion value B(n) and the second conversion value A(n). The operation circuit M3 stores the angle φ(n) between the expected value conversion characteristic and the conversion characteristic in the storage circuit M4 (step S16).

In order to check whether or not the third conversion value B(n) corresponds to the conversion characteristic, the operation circuit M3 reads the angle φ(n) from the storage circuit M4 to check whether or not the angle is "0". Here, it is assumed that the third conversion value B (n) is determined to correspond to the conversion characteristic. That is, it is assumed that the angle φ(n) is 0 (step S17—YES). In this case, the operation circuit M3 determines that phase adjustment has been made for an optimum delay value, followed by setting a signal level of the control signal T5 supplied to the terminal IN3 to the inactive state of "0" and setting a signal level of the control signal T7 supplied to the terminal IN5 to the active state of "1". In response to the control signal T7 of "1", the input signal selecting circuit M1 outputs the fourth voltage signal T1 supplied to the terminal IN1 via the terminal AIN from the terminal OUT1 to the A/D converter M2 as the fourth voltage signal T14 (analog signal S4). The A/D converter M2 carries out in response to the sampling clock signal T13, the A/D conversion on the fourth voltage signal T14 (analog signal S4) supplied from the input signal selecting circuit M1, and outputs a fourth conversion value T3 obtained thus.

In contrast, it is assumed that the third conversion value B(n) does not correspond to the conversion characteristic. That is, it is assumed that the angle φ(n) is not "0" (step S17—NO). In this case, the operation circuit M3 outputs the delay value selection signal T10 to the sampling timing adjuster M5. In response to the $J^{th}$ (J is an integer which satisfies 1≦J≦N) delay value selection signal T10, the sampling timing adjuster M5 selects $J^{th}$ delay value D(n) (n=J) from the N delay values (step S13), and the delay circuit M6 delays the reference sampling clock signal T12 by the $J^{th}$ delay value D(n) (n=J), and supplies the delayed signal as the sampling clock signal T13 to the A/D converter M2. In the case of the first delay value selection signal T10, J is "1" (step S14—YES). In this case, in response to the first delay value selection signal T10, the sampling timing adjuster M5 delays the reference sampling clock signal T12 by the first delay value D(n) (n=1) to generate the sampling clock signal T13 and supplies the sampling clock signal T13 to the A/D converter M2 (step S3). Then, the step S4 and the subsequent steps are executed.

Also, it is assumed that the angle φ(n) is not "0" in the N delay values even if the step S17 is executed N times. In this case, since the step S16 is executed N times, N angles φ(n) are stored in the storage circuit M4 in order. The operation circuit M3 then selects an $I^{th}$ (I is an integer expressing any of 1 to N) angle which is the smallest angle from the N angles φ(n) stored in the storage circuit M4, and outputs a delay value selection signal to the sampling timing adjuster M5, so as to select a delay value corresponding to the smallest angle (step S13). In response to the delay value selection signal, the sampling timing adjuster M5 selects the delay value from the N delay values, and the delay circuit M6 delays the reference sampling clock signal T12 by the selected delay value D(n) (n=I) to generate the sampling clock signal T13 and supplies the sampling clock signal T13 to the A/D converter M2 (steps S14—NO and S18).

In this case, the operation circuit M3 sets the signal level of the control signal T5 supplied to the terminal IN3 to the inactive state of "0" and sets the signal level of the control signal T7 supplied to the terminal IN5 to the active state of "1". In response to the control signal T7 of "1", the input signal selecting circuit M1 outputs the analog voltage T1 supplied to the terminal IN1 via the terminal AIN from the terminal OUT1 to the A/D converter M2 as the fourth voltage signal T14 (analog signal S4). The A/D converter M2 carries out in response to the sampling clock signal T13, the A/D conversion on the voltage signal T14 (analog signal S4) supplied from the input signal selecting circuit M1, and outputs the fourth conversion value T3 obtained thus.

As described above, in the A/D conversion circuit according to the second embodiment of the present invention, it is possible to always adjust to an optimum phase difference, a phase difference between the sampling and holding timing and the timing of noise propagated through substrate due to a clock signal of a digital circuit, by setting sampling and holding timing of the A/D conversion circuit in accordance with actual operating environment in the same manner with the first embodiment, even if the noise amplitude and the phase are changed depending on an operational voltage, manufacturing variations and a temperature drift.

Although the present invention has been described above in connection with several embodiments thereof, it would be apparent to those skilled in the art that those embodiments are provided solely for illustrating the present invention, and should not be relied upon to construe the appended claims in a limiting sense.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An A/D (analog-to-digital) conversion circuit comprising:
   an input signal selecting circuit configured to output voltage signals of different signal levels in response to control signals in an adjustment mode before A/D conversion of an analog signal in a practical mode;
   an A/D converter configured to perform A/D conversion on the voltage signals in response to an adjustment sampling clock signal in the adjustment mode to output adjustment conversion values;

a sampling timing adjusting circuit configured to delay a reference sampling clock signal based on a delay value selected in response to a selection signal in the adjustment mode to output the adjustment sampling clock signal to said A/D converter; and an operation circuit configured to set the adjustment mode, output the control signals to said input signal selecting circuit, and the selection signal to said sampling timing adjusting circuit, such that the adjustment conversion values are obtained at each of different delay values, determine an optimal parameter from parameters corresponding to the obtained adjustment conversion values, and set the practical mode to output the selection signal corresponding to the optimal parameter to said sampling timing adjusting circuit.

2. The A/D conversion circuit according to claim 1, wherein said input signal selecting circuit outputs an analog signal to said A/D converter in the practical mode, said sampling timing adjusting circuit delays the reference sampling clock signal based on the delay value selected in response to the selection signal corresponding to the optimal parameter in the practical mode to output a practical sampling clock signal to said A/D converter, and said A/D converter performs the A/D conversion on the analog signal in response to the practical sampling clock signal in the practical mode to output a practical conversion value.

3. The A/D conversion circuit according to claim 1, wherein said input signal selecting circuit outputs first to third voltage signals as the voltage signals in response to first to third control signals, respectively, wherein a signal level of the second voltage signal is lower than of that of the first voltage signal, and a signal level of the third voltage signal is between that of the first voltage signal and that of the second voltage signal, and said operation circuit sequentially outputs the first to third control signals as the control signals, at each time of the output of the selection signal, generates a conversion characteristic showing a relation of a voltage difference between the signal levels of the first and second voltage signals, and a difference between first and second conversion values as the adjustment conversion values of the first and second voltage signals, determines the parameters from a third conversion value as the adjustment conversion value of the third voltage signal at each time of the output of the selection signal, and determines the optimal parameter.

4. The A/D conversion circuit according to claim 3, wherein said operation circuit determines an expected value from the conversion characteristic and the third voltage signal, checks whether or not the third conversion value and the expected value are coincident with each other, determines a difference between the third conversion value and the expected value as the parameter, when the third conversion value and the expected value are not coincident with each other, and determines the smallest one of the differences as the optimal parameter.

5. The A/D conversion circuit according to claim 3, wherein said operation circuit sets the practical mode when the third conversion value and the expected value are coincident with each other.

6. The A/D conversion circuit according to claim 3, wherein said operation circuit determines an angle from the conversion characteristic and the third conversion value, checks whether or not the angle is "0", determines the angle as the parameter, when the determined angle is not "0", and determines the smallest one of the angles as the optimal parameter.

7. The A/D conversion circuit according to claim 6, wherein said operation circuit sets the practical mode when the angle is "0".

8. The A/D conversion circuit according to claim 3, wherein said input signal selecting circuit comprises:

a first resistance element, one end of which is supplied with a high voltage signal; and a second resistance element, one end of which is connected with the other end of the first resistance element, and the other end of which is supplied with a low voltage signal, and wherein said input signal selecting circuit outputs the high voltage signal as the first voltage signal, the low voltage signal as the second voltage signal, and a voltage signal at a node between said first resistance element and said second resistance element as the third voltage signal.

9. The A/D conversion circuit according to claim 3, wherein the first voltage signal has the signal level of a power supply voltage and the second voltage signal has the signal level of ground voltage.

10. An A/D (analog-to-digital) conversion method comprising:

setting an adjustment mode;

generating control signals to an input signal selecting circuit, each time generating a selection signal to a sampling timing adjusting circuit in the adjustment mode, such that adjustment conversion values are obtained at each of different delay values;

outputting voltage signals of different signal levels from said input signal selecting circuit in response to the control signals in the adjustment mode before A/D conversion of an analog signal in a practical mode;

delaying a reference sampling clock signal based on the delay value selected in response to the selection signal in said sampling timing adjusting circuit in the adjustment mode to output an adjustment sampling clock signal to an A/D converter; performing A/D conversion on the voltage signals in response to the adjustment sampling clock signal in said A/D converter in the adjustment mode to output adjustment conversion values;

determining an optimal parameter from parameters corresponding to the obtained adjustment conversion values; and setting the practical mode to output the selection signal corresponding to the optimal parameter to said sampling timing adjusting circuit.

11. The A/D conversion method according to claim 10, further comprising:

outputting an analog signal from said input signal selecting circuit to said A/D converter in the practical mode;

delaying the reference sampling clock signal based on the delay value selected in response to the selection signal corresponding to the optimal parameter in said sampling timing adjusting circuit in the practical mode to output a practical sampling clock signal to said A/D converter; and performing the A/D conversion on the analog signal in response to the practical sampling clock signal in said A/D converter in the practical mode to output a practical conversion value.

12. The A/D conversion method according to claim 10, wherein said generating control signal comprises:
- sequentially outputting the first to third control signals as the control signals, at each time of the output of the selection signal, wherein said outputting voltage signals comprises:
- outputting first to third voltage signals as the voltage signals in response to first to third control signals, respectively, wherein a signal level of the second voltage signal is lower than of that of the first voltage signal, and a signal level of the third voltage signal is between that of the first voltage signal and that of the second voltage signal, and wherein said determining an optimal parameter comprises:
- generating a conversion characteristic showing a relation of a voltage difference between the signal levels of the first and second voltage signals, and a difference between first and second conversion values as the adjustment conversion values of the first and second voltage signals;
- determining the parameters from a third conversion value as the adjustment conversion value of the third voltage signal at each time of the output of the selection signal; and
- determining the optimal parameter from the parameters.

13. The A/D conversion method according to claim 12, wherein said determining the parameters comprises:
- determining an expected value from the conversion characteristic and the third voltage signal;
- checking whether or not the third conversion value and the expected value are coincident with each other; and
- determines a difference between the third conversion value and the expected value as the parameter, when the third conversion value and the expected value are not coincident with each other, and wherein said determining the optimal parameter comprises:
- determining the smallest one of the differences as the optimal parameter.

14. The A/D conversion method according to claim 12, further comprising:
- setting the practical mode when the third conversion value and the expected value are coincident with each other.

15. The A/D conversion method according to claim 12, wherein said determining the parameters comprise:
- determining an angle from the conversion characteristic and the third conversion value;
- checking whether or not the angle is "0"; and
- determining the angle as the parameter, when the determined angle is not "0", and wherein said determining the optimal parameter comprises:
- determining the smallest one of the angles as the optimal parameter.

16. The A/D conversion method according to claim 15, further comprising:
- setting the practical mode when the angle is "0".

17. The A/D conversion method according to claim 12, wherein said input signal selecting circuit comprises first and second resistance elements connected in series,
- one end of the first resistance element is supplied with a high voltage signal, and one end of the second resistance element is connected with the other end of the first resistance element, and the other end of the second resistance element is supplied with a low voltage signal, and wherein said outputting first to third voltage signals comprises:
- outputting the high voltage signal as the first voltage signal, the low voltage signal as the second voltage signal, and a voltage signal at a node between said first resistance element and said second resistance element as the third voltage signal.

18. The A/D conversion method according to claim 12, wherein the first voltage signal has the signal level of a power supply voltage and the second voltage signal has the signal level of ground voltage.

* * * * *